(12) United States Patent
Chen et al.

(10) Patent No.: US 12,199,598 B2
(45) Date of Patent: Jan. 14, 2025

(54) CIRCUIT FOR PREVENTING LATCH-UP AND INTEGRATED CIRCUIT

(71) Applicant: Chipone Technology (Beijing) Co., Ltd., Beijing (CN)

(72) Inventors: Tianhao Chen, Beijing (CN); Junjie Wu, Beijing (CN)

(73) Assignee: CHIPONE TECHNOLOGY (BEIJING) CO., LTD., Beijing (CN)

( * ) Notice: Subject to any disclaimer, the term of this patent is extended or adjusted under 35 U.S.C. 154(b) by 310 days.

(21) Appl. No.: 17/705,656

(22) Filed: Mar. 28, 2022

(65) Prior Publication Data

US 2022/0360260 A1  Nov. 10, 2022

Related U.S. Application Data

(63) Continuation-in-part of application No. 16/628,017, filed on Dec. 31, 2019, now abandoned.

(51) Int. Cl.
  *H03K 17/16*  (2006.01)
(52) U.S. Cl.
  CPC .................... *H03K 17/16* (2013.01)
(58) Field of Classification Search
  CPC ................ H03K 17/08; H03K 17/081; H03K 17/08104; H03K 17/08108; H03K 17/08112; H03K 17/08116; H03K 17/082; H03K 17/0822; H03K 17/0824; H03K 17/0826; H03K 17/0828; H03K 17/51; H03K 17/56; H03K 17/60; H03K 17/602; H03K 17/687; H03K 17/6871; H03K 17/6872; H03K 17/20; H03K 17/16;
  (Continued)

(56) References Cited

U.S. PATENT DOCUMENTS

| | | |
|---|---|---|
| 2007/0164774 A1 | 7/2007 | Cecchi |
| 2007/0205801 A1* | 9/2007 | Perisetty .......... H03K 19/00315 326/26 |
| 2014/0027810 A1 | 1/2014 | Yang et al. |

* cited by examiner

*Primary Examiner* — Thienvu V Tran
*Assistant Examiner* — Carlos O Rivera-Perez
(74) *Attorney, Agent, or Firm* — Treasure IP Group, LLC

(57) ABSTRACT

Disclosed is an circuit for preventing latch-up, comprising a first transistor, a second transistor of a type opposite to that of the first transistor, and a control circuit, wherein a control terminal of the first transistor receives a first control voltage and a first terminal of the first transistor receives a first supply voltage; a control terminal of the second transistor receives a second control voltage, and is connected to a second terminal of the first transistor; a first terminal of the second transistor is connected to the control terminal of the first transistor, and a second terminal of the second transistor receives a second supply voltage. The control circuit is coupled on a path formed by the first transistor and the second transistor between the first supply voltage and the second supply voltage for disconnecting the path when the first control voltage and/or the second control voltage is out of a predetermined range. The circuit for preventing latch-up provided by the present invention, by introducing the control circuit on the path formed by the first transistor and the second transistor between the first supply voltage and the second supply voltage, can disconnect the path when the first control voltage and/or the second control voltage is out of the predetermined range, so that a latch-up effect is prevented from occurring during power-on phase.

13 Claims, 5 Drawing Sheets

(58) Field of Classification Search
CPC .. H03K 17/161; H03K 17/162; H03K 17/168;
H01L 27/0203; H01L 27/0248; H01L
27/0251; H01L 27/0259; H01L 27/0262;
H01L 27/0266; H01L 27/027; H01L
27/0274; H01L 27/0277; H01L 29/74;
H01L 29/7404; H01L 29/742; H01L
29/7424; H01L 27/092; H01L 27/0921;
H01L 27/0922; H01L 27/0924; H01L
27/0925; H01L 27/0927; H01L 27/0928;
H02M 1/32; H02H 9/04; H02H 9/043;
H02H 9/045; H02H 9/046
USPC ......... 361/18, 54–57, 59, 60, 67, 78, 79, 86,
361/88–92, 111; 323/271–278, 282–286,
323/351, 901; 363/49, 50, 56.12, 57;
326/62, 80–91; 327/141–143, 154, 198;
438/133–140
See application file for complete search history.

*-- Prior Art --*

*-- Prior Art --*

CIRCUIT FOR PREVENTING LATCH-UP AND INTEGRATED CIRCUIT

CROSS-REFERENCE TO RELATED APPLICATIONS

This application is a continuation-in-part to the U.S. patent application Ser. No. 16/628,017, filed on Mar. 19, 2019, entitled "Circuit for Preventing Latch-Up and Integrated Circuit". Further, this application claims priority from Chinese Patent Application No. 201810227939.X, submitted to Patent Office of the People's Republic of China, filed on Mar. 20, 2018 and entitled by "Circuit for preventing latch-up and Integrated circuit", the entire contents of which are incorporated by reference in the present application.

FIELD OF TECHNOLOGY

The present invention relates to the technical field of integrated circuit, in particular, to a circuit for preventing latch-up and an integrated circuit.

BACKGROUND

With the development of IC manufacturing processes, the size of chips is getting smaller and smaller, the density and integration degree of chip packaging are getting higher and higher, accordingly, the possibility of latch-up is increasing, and the possibility of mutual interference between modules will also increase. Parasitic transistors (also known as parasitic thyristors, or SCR for short) exist in general integrated circuits. Latch-up effect means that a parasitic bipolar transistor is triggered to turn on, forming a low-impedance and large-current path between the power supply VDD and the ground GND, resulting in the integrated circuit not working properly or even burning. Such parasitic bipolar transistors have various parts of the integrated circuit, including input terminals, output terminals, internal inverters, and the like.

FIGS. 1 and 2 respectively illustrate a structural view and an equivalent circuit diagram of a parasitic thyristor in the prior art. As shown in FIGS. 1 and 2, the parasitic bipolar transistor consists of a PNP transistor and a lateral NPN transistor. Q1 is a vertical Bipolar Junction Transistor (BJT), wherein a control terminal of Q1 is an N-type well region, a second terminal of Q1 is a P-type substrate, and a first terminal of Q1 is a P-channel. Q2 is a side Bipolar Junction Transistor (BJT), wherein a control terminal of Q2 is a P-type substrate, a second terminal of Q2 is an N-type well region, and a first terminal of Q2 is an N-channel. The above two elements constitute a SCR thyristor circuit. When no external interference has caused a trigger, the two BJTs are in the off state, and the current of the second terminal of Q1 is composed of the reverse leakage current of the second terminal of Q1-the control terminal of Q2, and the current of the second terminal of Q2 is composed of the reverse leakage current of the second terminal of Q2-the control terminal of Q1 so that the current gain of the SCR thyristor circuit is very small and there is no latch-up effect. When the current of the second terminal of one of the BJTs is suddenly increased to a certain value by external interference, it will be fed back to another BJT, so that the two BJTs are turned on by the trigger, and a low-impedance and large-current path is formed between the power supply VDD and the ground GND to generate the latch-up effect. For example, when the voltage $V_P$ at the second terminal of Q1 rises and the voltage $V_N$ at the second terminal of Q2 falls, a latch-up effect occurs in the SCR thyristor circuit.

SUMMARY OF THE INVENTION

In view of the above problems, the purpose of the present invention is to provide a circuit for preventing latch-up and an integrated circuit, which is resistant to latch-up.

According to one aspect of the present invention, a circuit for preventing latch-up is provided, comprising a first transistor having a control terminal, a first terminal and a second terminal, a second transistor of a type opposite to that of the first transistor having a control terminal, a first terminal and a second terminal, and a control circuit. The control terminal of the first transistor receives a first control voltage and the first terminal of the first transistor receives a first supply voltage. The control terminal of the second transistor receives a second control voltage, and is connected to the second terminal of the first transistor; the first terminal of the second transistor is connected to the control terminal of the first transistor, and the second terminal of the second transistor receives a second supply voltage. The control circuit is disposed on a path formed by the first transistor and the second transistor between the first supply voltage and the second supply voltage, and is used for disconnecting the path when the first control voltage and/or the second control voltage is out of a predetermined range is configured to prevent the first terminal of the first transistor from receiving the first supply voltage according to the first control voltage, and/or to prevent the second terminal of the second transistor from receiving the second supply voltage according to the second control voltage, so as to disconnect the path when the first control voltage is out of a first predetermined range and/or the second control voltage is out of a second predetermined range, wherein the first predetermined range is adjustable according to a value of the first control voltage of the first transistor in a working state, and/or the second predetermined range is adjustable according to a value of the second control voltage of the second transistor in the working state.

Preferably, the control circuit is coupled between the first supply voltage and the first transistor, and comprises a first comparison module and a first switch module; the first comparison module is used to output a first switch signal for turning off the first switch module when the first control voltage is out of a first predetermined range; the first switch module is used to disconnect the first supply voltage from the first transistor when receiving the first switch signal.

Preferably, the first comparison module is a first comparator, and the first switch module is a first switch transistor; a first input terminal of the first comparator receives the first control voltage, a second input terminal of the first comparator receives a first reference voltage, and the output terminal of the first comparator is connected to a control terminal of the first switch transistor; a first terminal of the first switch transistor receives the first supply voltage, and a second terminal of the first switch transistor is connected to the first terminal of the first transistor.

Preferably, the control circuit is coupled between the second supply voltage and the second transistor, and comprises a second comparison module and a second switch module; the second comparison module is used to output a second switch signal for turning off the second switch module when the second control voltage is out of a second predetermined range; the second switch module is used to disconnect the second supply voltage from the second transistor when receiving the second switch signal.

Preferably, the second comparison module is a second comparator, and the second switch module is a second switch transistor; a first input terminal of the second comparator receives the second control voltage, a second input terminal of the second comparator receives a second reference voltage, and the output terminal of the second comparator is connected to a control terminal of the second switch transistor; a first terminal of the second switch transistor receives the second supply voltage, and a second terminal of the second switch transistor is connected to the first terminal of the second transistor.

Preferably, the control circuit is coupled between the first supply voltage and the first transistor, and between the second supply voltage and the second transistor, and comprises a first comparison module, a first switch module, a second comparison module and a second switch module; the first comparison module is used to output a first switch signal for turning off the first switch module when the first control voltage is out of a first predetermined range; the first switch module is used to disconnect the first supply voltage from the first transistor when receiving the first switch signal; the second comparison module is used to output a second switch signal for turning off the second switch module when the second control voltage is out of a second predetermined range; the second switch module is used to disconnect the second supply voltage from the second transistor when receiving the second switch signal.

Preferably, the first comparison module is a first comparator, and the first switch module is a first switch transistor; the second comparison module is a second comparator, and the second switch module is a second switch transistor; a first input terminal of the first comparator receives the first control voltage, a second input terminal of the first comparator receives a first reference voltage, and the output terminal of the first comparator is connected to a control terminal of the first switch transistor; a first terminal of the first switch transistor receives the first supply voltage, and a second terminal of the first switch transistor is connected to the first terminal of the first transistor; a first input terminal of the second comparator receives the second control voltage, a second input terminal of the second comparator receives a second reference voltage, and the output terminal of the second comparator is connected to a control terminal of the second switch transistor; a first terminal of the second switch transistor receives the second supply voltage, and a second terminal of the second switch transistor is connected to the first terminal of the second transistor.

Preferably, the first switch transistor is a PMOS transistor, and the second switch transistor is an NMOS transistor.

Preferably, the first transistor is a PNP transistor, and the second transistor is an NPN transistor.

Preferably, the first supply voltage is larger than the second supply voltage.

Preferably, further comprises: a voltage divider circuit connected between a reference supply and ground, for providing initial reference voltages; and a multiplexer connected to the voltage divider circuit, for selecting a first reference voltage according to the value of the first control voltage of the first transistor in the working state, and/or selecting a second reference voltage according to a value of the second control voltage of the second transistor in the working state, wherein the first predetermined range is a voltage range greater than the first reference voltage, and the second predetermined range is a voltage range less than the second reference voltage.

Preferably, a control terminal of the multiplexer receives the first control voltage to selects the first reference voltage and/or a control terminal of the multiplexer receives the second control voltage to selects the second reference voltage.

Preferably, further comprising: a latch connected to the multiplexer, for latching the first reference voltage and/or the second reference voltage, and sending the first reference voltage and/or the second reference voltage to the control circuit.

According to another aspect of the present invention, an integrated circuit is provided, comprising the circuit for preventing latch-up described above.

The circuit for preventing latch-up and the integrated circuit provided by the present invention, by introducing the control circuit on the path formed by the first transistor and the second transistor between the first supply voltage and the second supply voltage, can disconnect the path when the first control voltage of the first transistor and/or the second control voltage of the second transistor is out of the predetermined range, so that a latch-up effect is prevented from occurring during power-on phase.

BRIEF DESCRIPTION OF THE DRAWINGS

The above and other objects, features and advantages of the present invention will become more apparent from the description below with reference to the accompanying drawings. In figures.

DESCRIPTION OF THE EMBODIMENTS

Figure 1:
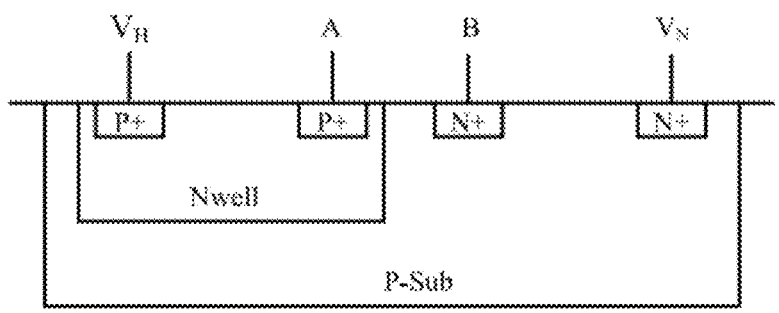
FIG. 1 illustrates a structural view of a parasitic thyristor in the prior art.
Figure 2:
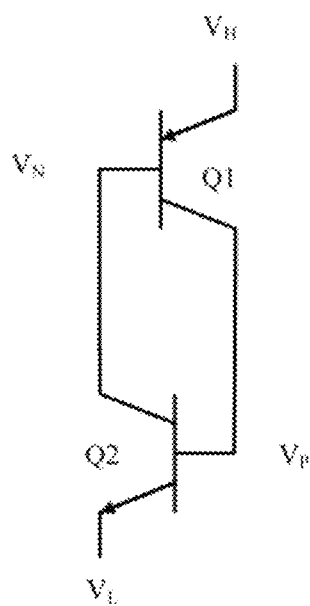
FIG. 2 illustrates an equivalent circuit diagram of the parasitic thyristor in FIG. 1.

Various embodiments of the present invention will be described in more detail below with reference to the accompanying drawings. In the various figures, the same elements are denoted by the same or similar reference numerals. For the sake of clarity, the various parts in the figures are not drawn to scale.

The specific implementation of the invention will be further described in detail in combination with drawings and the embodiment.

Figure 3:
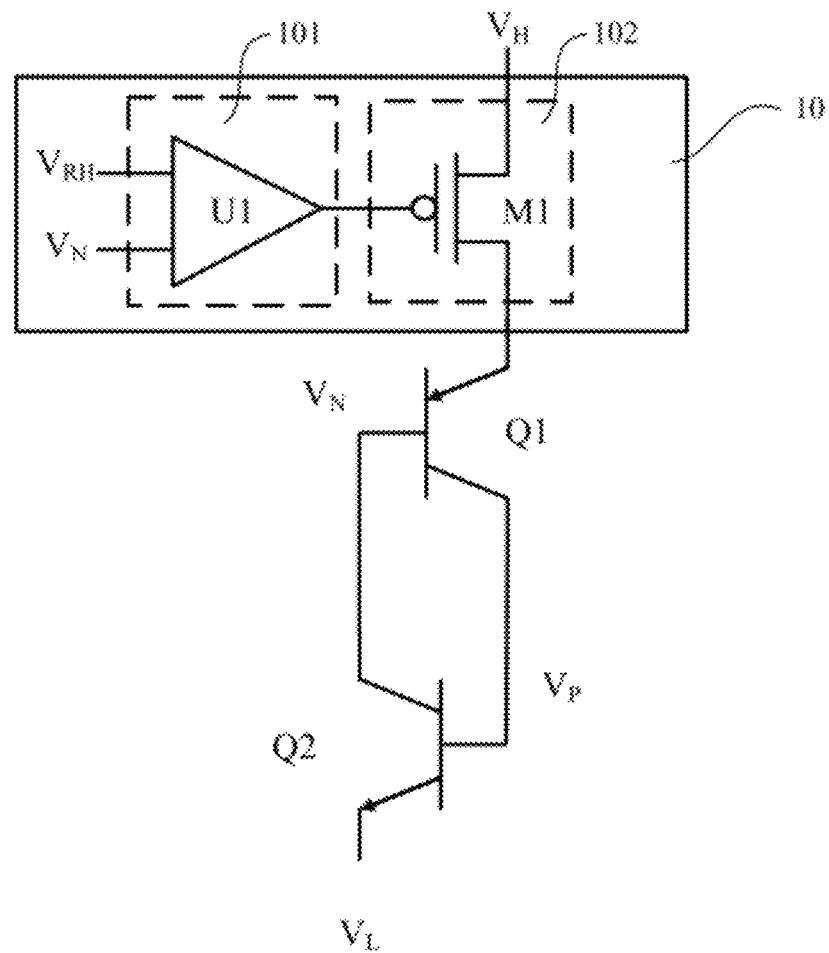
FIG. 3 illustrates a circuit diagram of a circuit for preventing latch-up according to a first embodiment of the present invention.

FIG. 3 illustrates a circuit diagram of a circuit for preventing latch-up according to a first embodiment of the present invention. As shown in FIG. 3, the circuit for preventing latch-up comprises a first transistor Q1, a second transistor Q2, and a control circuit 10.

The first transistor Q1 has a control terminal, a first terminal, and a second terminal, wherein the control terminal of the first transistor Q1 is configured to receive a first control voltage $V_N$, and the first terminal of the first transistor Q1 is configured to receive a first supply voltage $V_H$.

The second transistor Q2 is of a type opposite to that of the first transistor Q1, and has a control terminal, a first terminal, and a second terminal the control terminal of the second transistor Q2 is configured to receive a second control voltage $V_P$ and is connected to the second terminal of the first transistor Q1, the second terminal of the second transistor Q2 is connected to the control terminal of the first transistor Q1, the first terminal of the second transistor Q2 is configured to receive a second supply voltage $V_L$. In the present embodiment, the first transistor Q1 and the second transistor Q2 are opposite-type bipolar transistors, with the control terminals being bases, the first terminals being emitters, and the second terminals being collectors.

In a preferred embodiment, the first transistor Q1 is a PNP type bipolar transistor, and the second transistor Q2 is an NPN type bipolar transistor.

The control circuit 10 is disposed on a path formed by the first transistor Q1 and the second transistor Q2 between the first supply voltage $V_H$ and the second supply voltage $V_L$, and is used for disconnecting the path when the first control voltage $V_N$ and/or the second control voltage $V_P$ is out of a predetermined range.

In a preferred embodiment, the first predetermined range is adjustable according to a value of the first control voltage of the first transistor in a working state, so that the circuit for preventing latch-up having better stability and compatibility. For example, if the value of the first control voltage of the first transistor in the working state is 3V, the first predetermined range may be over 2.5V, so that the first switch transistor M1 being turned off when the first control voltage changed to below 2.5V; if the value of the first control voltage of the first transistor in the working state is 5V, the first predetermined range may be over 4.5V, so that the first switch transistor M1 being turned off when the first control voltage changed to below 4.5V.

The control circuit 10 is coupled between the first supply voltage $V_H$ and the first transistor Q1, and includes a first comparison module 101 and a first switch module 102.

Wherein, the first comparison module 101 is used to output a first switch signal for turning off the first switch module 102 when the first control voltage $V_N$ is out of a first predetermined range; the first switch module 102 is used to disconnect the first supply voltage $V_H$ from the first transistor Q1 when receiving the first switch signal.

In the present embodiment, the first comparison module 101 is a first comparator U1, and the first switch module 102 is a first switch transistor M1. A first input terminal of the first comparator U1 receives the first control voltage $V_N$, a second input terminal of the first comparator U1 receives a first reference voltage $V_{RH}$, and the output terminal of the first comparator U1 is connected to a control terminal of the first switch transistor M1;

a first terminal of the first switch transistor M1 receives the first supply voltage $V_H$, and a second terminal of the first switch transistor M1 is connected to the first terminal of the first transistor Q1.

When the first control voltage $V_N$<the first reference voltage $V_{RH}$, the first switch signal outputted by the first comparator U1 controls the first switch transistor M1 to be turned off. Wherein, the first reference voltage $V_{RH}$ may be equal to the first supply voltage $V_H$.

In a preferred embodiment, the first switch transistor M1 is a PMOS transistor; the control terminal of the first switch transistor M1 is a gate, the first terminal of the first switch transistor M1 is a source, and the second terminal of the first switch transistor M1 is a drain. The first switch signal is at a high level.

In a preferred embodiment, the first switch transistor M1 is a NMOS transistor; the control terminal of the first switch transistor M1 is a gate, the first terminal of the first switch transistor M1 is a drain, and the second terminal of the first switch transistor M1 is a source. The first switch signal is at a low level.

When a voltage disorder occurs (for example, a voltage disorder caused by static electricity or a circuit operation error), the first control voltage $V_N$ or the second control voltage $V_P$ may be changed. If the first control voltage $V_N$ is caused to drop first, the first transistor Q1 is turned on, and the first supply voltage $V_H$ is supplied to the control terminal of the second transistor Q2 when a voltage difference between the first terminal and the control terminal of the first transistor Q1 is greater than a turn-on voltage of the first transistor Q1, leading to the rise of the voltage $V_P$ at the control terminal of the second transistor Q2; the second transistor Q2 is turned on when a voltage difference between the control terminal and the first terminal of the second transistor Q2 is greater than a turn-on voltage of the second transistor Q2, generating a latch path. If the second control voltage $V_P$ is caused to rise first, the second transistor Q2 is turned on, and the second supply voltage $V_L$ is supplied to the control terminal of the first transistor Q1 when a voltage difference between the first terminal and the control terminal of the second transistor Q2 is greater than a turn-on voltage of the second transistor Q2, leading to the drop of the first control voltage $V_N$; the first transistor Q1 is turned on when a voltage difference between the control terminal and the first terminal of the first transistor Q1 is greater than a turn-on voltage of the first transistor Q1, generating a latch path.

Therefore, in the case of the voltage disorder, the first control voltage $V_N$ is directly or indirectly caused to drop. Comparing the first control voltage $V_N$ with the first reference voltage $V_{RH}$, the first comparator U1 outputs the first switch signal to control the first switch transistor M1 to be turned off when the first control voltage $V_N$<the first reference voltage $V_{RH}$, so that the current path of the first supply voltage $V_H$ is closed and no latch-up effect occurs.

The circuit for preventing latch-up provided by the present invention, by introducing the control circuit on the path formed by the first transistor and the second transistor between the first supply voltage and the second supply voltage, can disconnect the first supply voltage from the first transistor when the control voltage of the first transistor is out of a first predetermined range, so that a latch-up effect is prevented from occurring during power-on phase.

Figure 4:
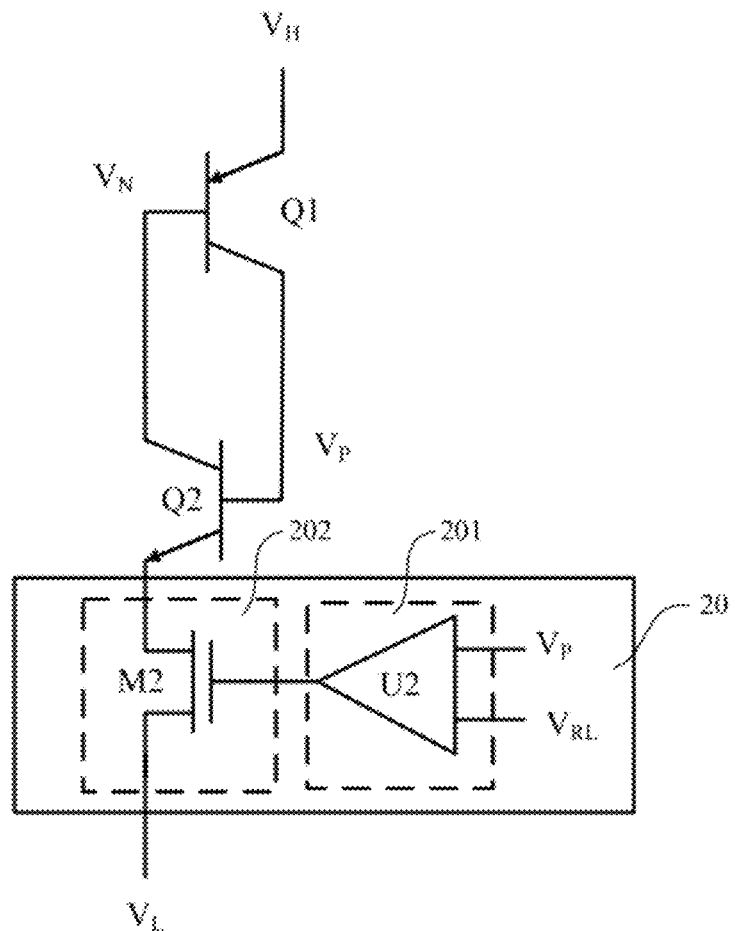
FIG. 4 illustrates a circuit diagram of a circuit for preventing latch-up according to a second embodiment of the present invention.

FIG. 4 illustrates a circuit diagram of a circuit for preventing latch-up according to a second embodiment of the present invention. Compared with the first embodiment, the difference is that the control circuit 20 is coupled between the second supply voltage $V_L$ and the second transistor Q2, and comprises a second comparison module 201 and a second switch module 202.

Wherein, the second comparison module 201 is used to output a second switch signal for turning off the second switch module 202 when the second control voltage $V_P$ is out of a second predetermined range; the second switch module 202 is used to disconnect the second supply voltage $V_L$ from the second transistor Q2 when receiving the second switch signal.

In a preferred embodiment, the second predetermined range is adjustable according to a value of the second control voltage of the second transistor in a working state, so that the circuit for preventing latch-up having better stability and compatibility. For example, if the value of the second control voltage of the second transistor in the working state is 3V, the second predetermined range may be below 3.5V, so that the second switch transistor M2 being turned off when the second control voltage changed to over 3.5V; if the value of the second control voltage of the second transistor in the working state is 5V, the second predetermined range may be below 5.5V, so that the second switch transistor M2 being turned off when the second control voltage changed to over 5.5V.

In the present embodiment, the second comparison module 201 is a second comparator U2, and the second switch module 202 is a second switch transistor M2. A first input terminal of the second comparator U2 receives the second control voltage $V_P$, a second input terminal of the second comparator U2 receives a second reference voltage $V_{RL}$, and the output terminal of the second comparator U2 is connected to a control terminal of the second switch transistor M2;

a first terminal of the second switch transistor M2 receives the second supply voltage $V_L$, and a second terminal of the second switch transistor M2 is connected to the first terminal of the second transistor Q2.

When the second control voltage $V_P$>the second reference voltage $V_{RL}$, the second switch signal outputted by the second comparator U2 controls the second switch transistor M2 to be turned off. Wherein, the second reference voltage $V_{RL}$ may be equal to the second supply voltage $V_L$.

In a preferred embodiment, the second switch transistor M2 is a PMOS transistor; the control terminal of the second switch transistor M2 is a gate, the first terminal of the second switch transistor M2 is a drain, and the second terminal of the second switch transistor M2 is a source. The second switch signal is at a high level.

In a preferred embodiment, the second switch transistor M2 is a NMOS transistor; the control terminal of the second switch transistor M2 is a gate, the first terminal of the second switch transistor M2 is a source, and the second terminal of the second switch transistor M2 is a drain. The second switch signal is at a low level.

In the case of the voltage disorder, the second control voltage $V_P$ is directly or indirectly caused to rise. Comparing the second control voltage $V_P$ with the second reference voltage $V_{RL}$, the second comparator U2 outputs a second switch signal to control the second switch transistor M2 to be turned off when the second control voltage $V_P$>the second reference voltage $V_{RL}$, so that the current path of the second supply voltage $V_L$ is closed and no latch-up effect occurs.

The circuit for preventing latch-up provided by the present invention, by introducing the control circuit on the path formed by the first transistor and the second transistor between the first supply voltage and the second supply voltage, can disconnect the second supply voltage from the second transistor when the control voltage of the second transistor is out of a second predetermined range, so that a latch-up effect is prevented from occurring in power-on phase.

Figure 5:
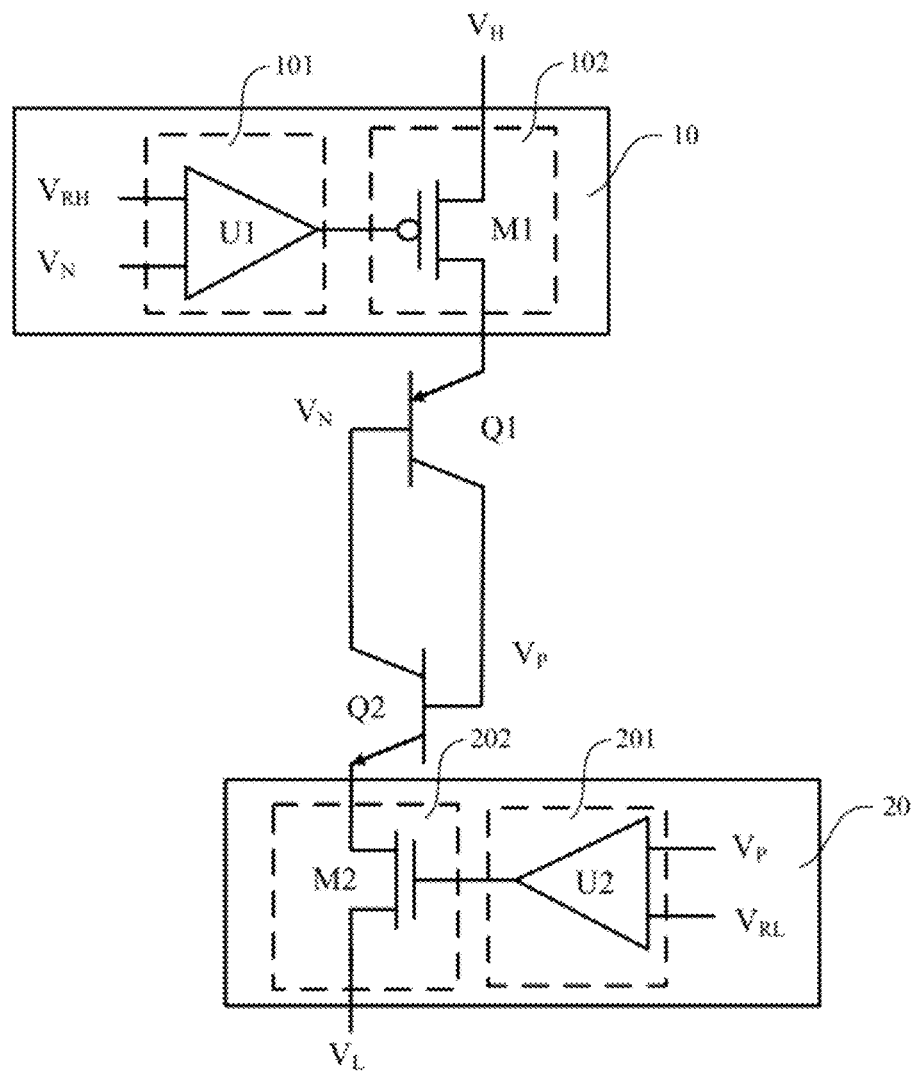
FIG. 5 illustrates a circuit diagram of a circuit for preventing latch-up according to a third embodiment of the present invention.

FIG. 5 illustrates a circuit diagram of a circuit for preventing latch-up according to a third embodiment of the present invention. Compared with the first embodiment, the difference is that the control circuit includes a first control circuit 10 and a second control circuit 20, wherein the first control circuit 10 is coupled between the first supply voltage $V_H$ and the first transistor Q1, and includes the first comparison module 101 and the first switch module 102. The second control circuit 20 is coupled between the second supply voltage $V_L$ and the second transistor Q2, and comprises a second comparison module 201 and a second switch module 202.

Wherein, the first comparison module 101 is used to output a first switch signal for turning off the first switch module 102 when the first control voltage $V_N$ is out of a first predetermined range; the first switch module 102 is used to disconnect the first supply voltage $V_H$ from the first transistor Q1 when receiving the first switch signal.

In the present embodiment, the first comparison module 101 is a first comparator U1, and the first switch module 102 is a first switch transistor M1. A first input terminal of the first comparator U1 receives the first control voltage $V_N$, a second input terminal of the first comparator U1 receives a first reference voltage $V_{RH}$, and the output terminal of the first comparator U1 is connected to a control terminal of the first switch transistor M1;

a first terminal of the first switch transistor M1 receives the first supply voltage $V_H$, and a second terminal of the first switch transistor M1 is connected to the first terminal of the first transistor Q1.

When the first control voltage $V_N$<the first reference voltage $V_{RH}$, the first switch signal outputted by the first comparator U1 controls the first switch transistor M1 to be turned off. Wherein, the first reference voltage $V_{RH}$ may be equal to the first supply voltage $V_H$.

In a preferred embodiment, the first switch transistor M1 is a PMOS transistor; the control terminal of the first switch transistor M1 is a gate, the first terminal of the first switch transistor M1 is a source, and the second terminal of the first switch transistor M1 is a drain. The first switch signal is at a high level.

In a preferred embodiment, the first switch transistor M1 is a NMOS transistor; the control terminal of the first switch transistor M1 is a gate, the first terminal of the first switch transistor M1 is a drain, and the second terminal of the first switch transistor M1 is a source. The first switch signal is at a low level.

The second comparison module 201 is used to output a second switch signal for turning off the second switch module 202 when the second control voltage $V_P$ is out of a second predetermined range; the second switch module 202 is used to disconnect the second supply voltage $V_L$ from the second transistor Q2 when receiving the second switch signal.

In the present embodiment, the second comparison module 201 is a second comparator U2, and the second switch module 202 is a second switch transistor M2. A first input terminal of the second comparator U2 receives the second control voltage $V_P$, a second input terminal of the second comparator U2 receives a second reference voltage $V_{RL}$, and the output terminal of the second comparator U2 is connected to a control terminal of the second switch transistor M2;

a first terminal of the second switch transistor M2 receives the second supply voltage $V_L$, and a second terminal of the second switch transistor M2 is connected to the first terminal of the second transistor Q2.

When the second control voltage $V_P$>the second reference voltage $V_{RL}$, the second switch signal outputted by the second comparator U2 controls the second switch transistor M2 to be turned off. Wherein, the second reference voltage $V_{RL}$ may be equal to the second supply voltage $V_L$.

In a preferred embodiment, the second switch transistor M2 is a PMOS transistor; the control terminal of the second switch transistor M2 is a gate, the first terminal of the second switch transistor M2 is a drain, and the second terminal of the second switch transistor M2 is a source. The second switch signal is at a high level.

In a preferred embodiment, the second switch transistor M2 is a NMOS transistor; the control terminal of the second switch transistor M2 is a gate, the first terminal of the second switch transistor M2 is a source, and the second terminal of the second switch transistor M2 is a drain. The second switch signal is at a low level.

In the case of the voltage disorder, the first control voltage $V_N$ is directly or indirectly caused to drop and the second control voltage $V_P$ to rise. Comparing the first control voltage $V_N$ with the first reference voltage $V_{RH}$ and the second control voltage $V_P$ with the second reference voltage $V_{RL}$, the first comparator U1 outputs a first switch signal to control the first switch transistor M1 to be turned off when the first control voltage $V_N$<the first reference voltage $V_{RH}$, and the second comparator U2 outputs a second switch signal to control the second switch transistor M2 to be turned off when the second control voltage $V_P$>the second reference voltage $V_{RL}$, so that the current paths of the first supply voltage $V_H$ and the second supply voltage $V_L$ are closed and no latch-up effect occurs.

Figure 6:
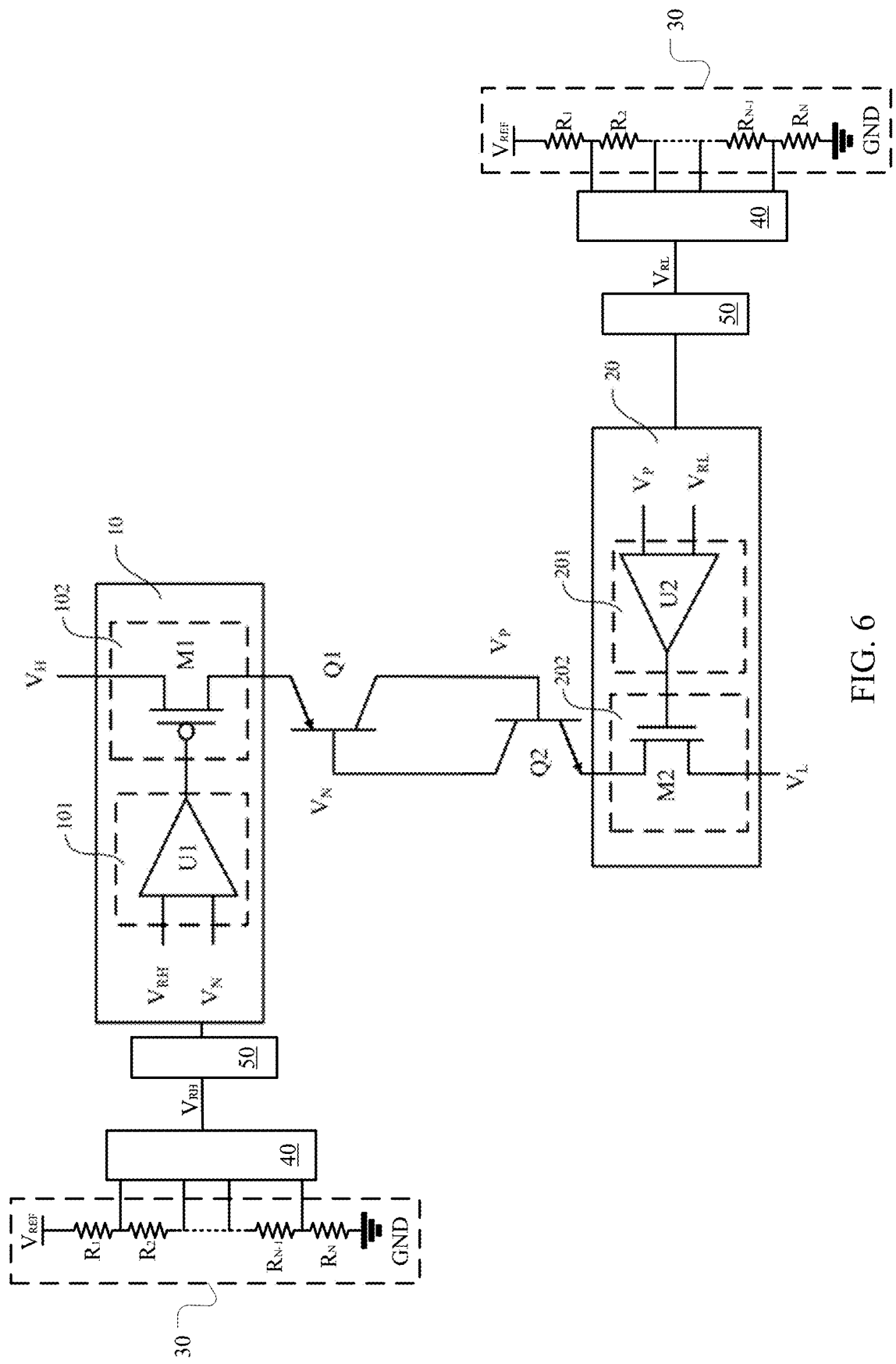
FIG. 6 illustrates a circuit diagram of a circuit for preventing latch-up according to a fourth embodiment of the present invention.

FIG. 6 illustrates a circuit diagram of a circuit for preventing latch-up according to a forth embodiment of the present invention. Compared with the third embodiment, the difference is that the control circuit further includes a voltage divider circuit 30 and a multiplexer 40, preferably, further includes a latch 50.

The voltage divider circuit 30 is connected between a reference supply $V_{REF}$ and ground GND, and is for providing initial reference voltages. For example, the voltage divider circuit 30 comprises a plurality of resistors $R_1$-$R_N$ in series, and series nodes between the plurality of resistors $R_1$-$R_N$ provide a plurality of initial reference voltages. The reference supply $V_{REF}$ is a power supply that is not affected by temperature, for example, the reference supply $V_{REF}$ is a bandgap reference supply, or other power circuits with a combination of positive temperature coefficient and negative temperature coefficient.

The multiplexer 40 is connected to the voltage divider circuit 30, and is for selecting a first reference voltage according to the value of the first control voltage of the first transistor in the working state, and/or selecting a second reference voltage according to a value of the second control voltage of the second transistor in the working state. The first predetermined range is a voltage range greater than the first reference voltage, and the second predetermined range is a voltage range less than the second reference voltage.

For example, if the value of the first control voltage of the first transistor in the working state is 3V, the multiplexer 40 selects 2.5V serves as the first reference voltage, and the first predetermined range is over 2.5V, so that the first switch transistor M1 being turned off when the first control voltage changed to below 2.5V; if the value of the first control voltage of the first transistor in the working state is 5V, the multiplexer 40 selects 4.5V serves as the first reference voltage, and the first predetermined range is over 4.5V, so that the first switch transistor M1 being turned off when the first control voltage changed to below 4.5V.

For example, if the value of the second control voltage of the second transistor in the working state is 3V, the multiplexer 40 selects 3.5V serves as the first reference voltage, and the second predetermined range is below 3.5V, so that the second switch transistor M2 being turned off when the second control voltage changed to over 3.5V; if the value of the second control voltage of the second transistor in the working state is 5V, the second predetermined range is below 5.5V, so that the second switch transistor M2 being turned off when the second control voltage changed to over 5.5V.

In a preferred embodiment, a control terminal of the multiplexer 40 receives the first control voltage to selects the first reference voltage, and/or a control terminal of the multiplexer 40 receives the second control voltage to selects the second reference voltage. In this embodiment, the circuit for preventing latch-up further includes a latch 50 connected to the multiplexer 40, the latch 50 is for latching the first reference voltage and/or the second reference voltage, and sending the first reference voltage and/or the second reference voltage to the control circuit 10/20.

In FIG. 6, two voltage divider circuits 30, two multiplexers 40 and two latches 50 are shown to control the control circuit 10 and the control circuit 20 respectively, it should be understood that the control circuit 10 and the control circuit 20 may share one voltage divider circuit 30, one multiplexer 40 and one latch 50.

The circuit for preventing latch-up provided by the present invention, by introducing the control circuit on the path formed by the first transistor and the second transistor between the first supply voltage and the second supply voltage, can disconnect the first supply voltage from the first transistor when the first control voltage of the first transistor is out of a first predetermined range, and can disconnect the second supply voltage from the second transistor when the second control voltage of the second transistor is out of a second predetermined range, so that a latch-up effect is prevented from occurring during power-on phase.

The present invention further provides an integrated circuit comprising the circuit for preventing latch-up according to any one of above embodiments.

The embodiments in accordance with the present invention, as described above, are not described in detail, and are not intended to limit the present invention to be only the described particular embodiments. Obviously, many modifications and variations are possible in light of the above. These embodiments has been chosen and described in detail in the specification to explain the principles and practical applications of the present invention so that those skilled in the art can make good use of the present invention and the modified invention based on the present invention. The invention is to be limited only by the scope of the appended claims and the equivalents of the appended claims.

The invention claimed is:

1. A circuit for preventing latch-up, comprising:
   a first transistor having a control terminal, a first terminal, and a second terminal, wherein the control terminal of the first transistor is configured to receive a first control voltage, and the first terminal of the first transistor is configured to receive a first supply voltage;
   a second transistor of a type opposite to that of the first transistor having a control terminal, a first terminal, and a second terminal, wherein the control terminal of the second transistor is configured to receive a second control voltage and is connected to the second terminal of the first transistor, the first terminal of the second transistor is connected to the control terminal of the first transistor, the second terminal of the second transistor is configured to receive a second supply voltage;
   a control circuit disposed on a path formed by the first transistor and the second transistor between the first supply voltage and the second supply voltage, is configured to prevent the first terminal of the first transistor from receiving the first supply voltage according to the first control voltage, and/or to prevent the second terminal of the second transistor from receiving the second supply voltage according to the second control voltage, so as to disconnect the path when the first control voltage is out of a first predetermined range and/or the second control voltage is out of a second predetermined range;

a voltage divider circuit connected between a reference supply and ground, for providing initial reference voltages; and a multiplexer connected to the voltage divider circuit, for selecting a first reference voltage according to the value of the first control voltage of the first transistor in the working state, and/or selecting a second reference voltage according to a value of the second control voltage of the second transistor in the working state, wherein the first predetermined range is adjustable according to a value of the first control voltage of the first transistor in a working state, and/or the second predetermined range is adjustable according to a value of the second control voltage of the second transistor in the working state, the first predetermined range is a voltage range greater than the first reference voltage, and the second predetermined range is a voltage range less than the second reference voltage.

2. The circuit for preventing latch-up according to claim 1, wherein the control circuit is coupled between the first supply voltage and the first transistor, and comprises a first comparison module and a first switch module, the first comparison module is used to output a first switch signal for turning off the first switch module when the first control voltage is out of the first predetermined range;

the first switch module is used to disconnect the first supply voltage from the first transistor when receiving the first switch signal.

3. The circuit for preventing latch-up according to claim 2, wherein the first comparison module is a first comparator, and the first switch module is a first switch transistor; a first input terminal of the first comparator receives the first control voltage, a second input terminal of the first comparator receives the first reference voltage, and the output terminal of the first comparator is connected to a control terminal of the first switch transistor; a first terminal of the first switch transistor receives the first supply voltage, and a second terminal of the first switch transistor is connected to the first terminal of the first transistor.

4. The circuit for preventing latch-up according to claim 1, wherein the control circuit is coupled between the second supply voltage and the second transistor, and comprises a second comparison module and a second switch module, the second comparison module is used to output a second switch signal for turning off the second switch module when the second control voltage is out of the second predetermined range;

the second switch module is used to disconnect the second supply voltage from the second transistor when receiving the second switch signal.

5. The circuit for preventing latch-up according to claim 4, wherein the second comparison module is a second comparator, and the second switch module is a second switch transistor; a first input terminal of the second comparator receives the second control voltage, a second input terminal of the second comparator receives the second reference voltage, and the output terminal of the second comparator is connected to a control terminal of the second switch transistor; a first terminal of the second switch transistor receives the second supply voltage, and a second terminal of the second switch transistor is connected to the second terminal of the second transistor.

6. The circuit for preventing latch-up according to claim 1, wherein the control circuit is coupled between the first supply voltage and the first transistor, and between the second supply voltage and the second transistor, and comprises a first comparison module, a first switch module, a second comparison module and a second switch module, the first comparison module is used to output a first switch signal for turning off the first switch module when the first control voltage is out of the first predetermined range;

the first switch module is used to disconnect the first supply voltage from the first transistor when receiving the first switch signal;

the second comparison module is used to output a second switch signal for turning off the second switch module when the second control voltage is out of the second predetermined range;

the second switch module is used to disconnect the second supply voltage from the second transistor when receiving the second switch signal.

7. The circuit for preventing latch-up according to claim 6, wherein the first comparison module is a first comparator, and the first switch module is a first switch transistor; the second comparison module is a second comparator, and the second switch module is a second switch transistor; a first input terminal of the first comparator receives the first control voltage, a second input terminal of the first comparator receives the first reference voltage, and the output terminal of the first comparator is connected to a control terminal of the first switch transistor; a first terminal of the first switch transistor receives the first supply voltage, and a second terminal of the first switch transistor is connected to the first terminal of the first transistor; a first input terminal of the second comparator receives the second control voltage, a second input terminal of the second comparator receives the second reference voltage, and the output terminal of the second comparator is connected to a control terminal of the second switch transistor; a first terminal of the second switch transistor receives the second supply voltage, and a second terminal of the second switch transistor is connected to the second terminal of the second transistor.

8. The circuit for preventing latch-up according to claim 7, wherein the first switch transistor is a PMOS transistor, and the second switch transistor is an NMOS transistor.

9. The circuit for preventing latch-up according to claim 1, wherein the first transistor is a PNP transistor, and the second transistor is an NPN transistor.

10. The circuit for preventing latch-up according to claim 9, wherein the first supply voltage is larger than the second supply voltage.

11. The circuit for preventing latch-up according to claim 1, wherein a control terminal of the multiplexer receives the first control voltage to selects the first reference voltage and/or a control terminal of the multiplexer receives the second control voltage to selects the second reference voltage.

12. The circuit for preventing latch-up according to claim 1, further comprising:

a latch connected to the multiplexer, for latching the first reference voltage and/or the second reference voltage, and sending the first reference voltage and/or the second reference voltage to the control circuit.

13. An integrated circuit, comprising the circuit for preventing latch-up according to claim 1.

\* \* \* \* \*